US012684836B2

(12) United States Patent
Iwahori

(10) Patent No.: US 12,684,836 B2
(45) Date of Patent: *Jul. 14, 2026

(54) SEMICONDUCTOR INTEGRATED CIRCUIT DEVICE

(71) Applicant: Socionext Inc., Kanagawa (JP)

(72) Inventor: Junji Iwahori, Yokohama (JP)

(73) Assignee: Socionext Inc., Kanagawa (JP)

( * ) Notice: Subject to any disclaimer, the term of this patent is extended or adjusted under 35 U.S.C. 154(b) by 231 days.

This patent is subject to a terminal disclaimer.

(21) Appl. No.: 18/767,734

(22) Filed: Jul. 9, 2024

(65) Prior Publication Data

US 2024/0363686 A1      Oct. 31, 2024

Related U.S. Application Data

(63) Continuation of application No. 17/889,106, filed on Aug. 16, 2022, now Pat. No. 12,062,694, which is a
(Continued)

(30) Foreign Application Priority Data

Feb. 25, 2020      (JP) ................................. 2020-029453

(51) Int. Cl.
*G11C 11/41* (2006.01)
*G11C 11/412* (2006.01)
(Continued)

(52) U.S. Cl.
CPC ......... *H10D 62/121* (2025.01); *G11C 11/412* (2013.01); *H10B 10/12* (2023.02);
(Continued)

(58) Field of Classification Search
CPC .... H10D 62/121; H10D 84/85; H10D 84/907; H10D 89/10; H10D 84/981; H10D 30/43;
(Continued)

(56) References Cited

U.S. PATENT DOCUMENTS 9,922,942 B2      3/2018  Balakrishnan et al.
2016/0111337 A1      4/2016  Hatcher et al.
(Continued)

FOREIGN PATENT DOCUMENTS

JP      H05-067634 A      3/1993
JP      2009-016525 A      1/2009
(Continued)

OTHER PUBLICATIONS

International Search Report (ISR) dated Apr. 20, 2021 issued in International Patent Application No. PCT/JP2021/004379 with English translation.
(Continued)

*Primary Examiner* — Uyen Smet
(74) *Attorney, Agent, or Firm* — Rimon P.C.

(57) ABSTRACT

A layout structure of a capacitive cell using forksheet FETs is provided. In transistors P3 and N3, VDD is supplied to a pair of pads 22c, 22d and a gate interconnect 36c, and VSS is supplied to a pair of pads 27c, 27d and a gate interconnect 31c. Capacitances are produced between nanosheets 21c and the gate interconnect 31c and between nanosheets 26c and the gate interconnect 36c. The faces of the nanosheets 21c closer to the nanosheets 26c are exposed from the gate interconnect 31c, and the faces of the nanosheets 26c closer to the nanosheets 21c are exposed from the gate interconnect 36c.

6 Claims, 13 Drawing Sheets

Related U.S. Application Data continuation of application No. PCT/JP2021/004379, filed on Feb. 5, 2021.

(51) Int. Cl.

| | |
|---|---|
| *H10B 10/00* | (2023.01) |
| *H10D 62/10* | (2025.01) |
| *H10D 84/85* | (2025.01) |
| *H10D 84/90* | (2025.01) |
| *H10D 89/10* | (2025.01) |
| *H10W 20/41* | (2026.01) |

(52) U.S. Cl.
CPC ........... *H10D 84/85* (2025.01); *H10D 84/907* (2025.01); *H10D 89/10* (2025.01); *H10W 20/427* (2026.01); *H10D 84/981* (2025.01)

(58) Field of Classification Search
CPC .... H10D 84/811; G11C 11/412; H10B 10/12; H10W 20/427; H10W 20/20
See application file for complete search history.

(56) References Cited

U.S. PATENT DOCUMENTS

| | | | |
|---|---|---|---|
| 2017/0069481 A1 | 3/2017 | Doris et al. | |
| 2018/0090624 A1 | 3/2018 | Cheng et al. | |
| 2019/0123063 A1 | 4/2019 | Hino et al. | |
| 2019/0198530 A1* | 6/2019 | Hino | H10D 84/811 |
| 2020/0126987 A1 | 4/2020 | Rubin et al. | |
| 2020/0335488 A1 | 10/2020 | Iwahori | |
| 2021/0020644 A1 | 1/2021 | Paul et al. | |
| 2021/0028191 A1 | 1/2021 | Hino et al. | |
| 2021/0193807 A1* | 6/2021 | Guha | H10D 30/6219 |
| 2021/0249509 A1* | 8/2021 | Wang | H10D 62/292 |

FOREIGN PATENT DOCUMENTS

| | | |
|---|---|---|
| WO | 2018/042986 A1 | 3/2018 |
| WO | 2019/138546 A1 | 7/2019 |

OTHER PUBLICATIONS

P. Weckx et al., "Stacked nanosheet fork architecture for SRAM design and device co-optimization toward 3nm", 2017 IEEE International Electron Devices Meeting (IEDM), Dec. 2017, IEDM17-505~508.

P. Weckx et al., "Novel forksheet device architecture as ultimate logic scaling device towards 2nm", 2019 IEEE International Electron Devices Meeting (IEDM), Dec. 2019, IEDM19-871~874.

Notice of Allowance dated Apr. 15, 2024 issued in U.S. Appl. No. 17/889,106.

* cited by examiner

FIG.5A
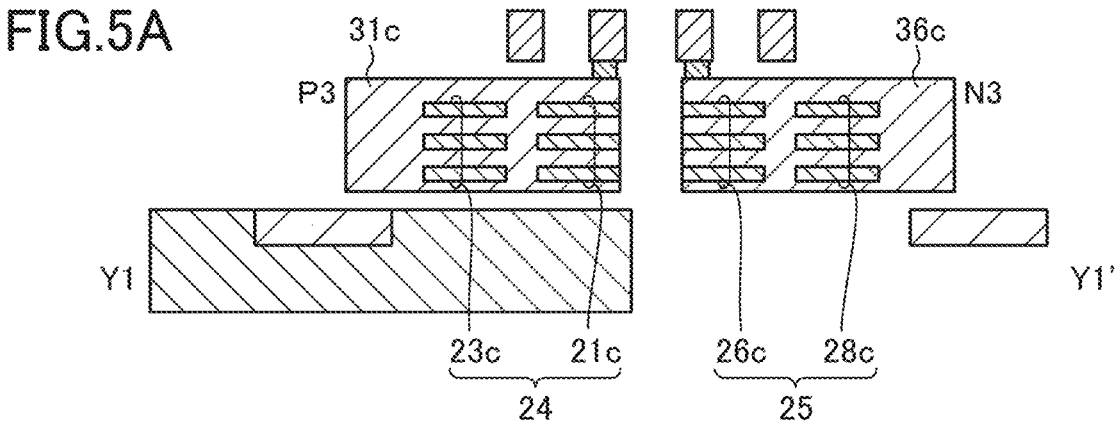
FIG.5B
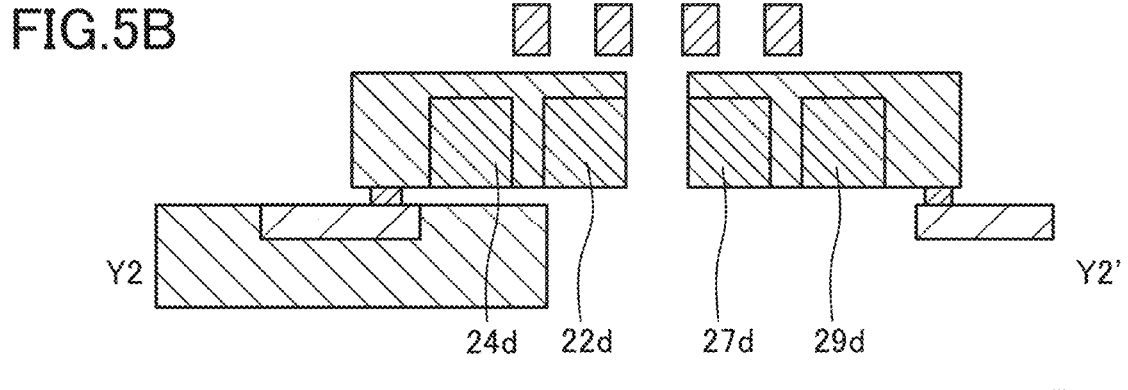
Z
↑
→ Y
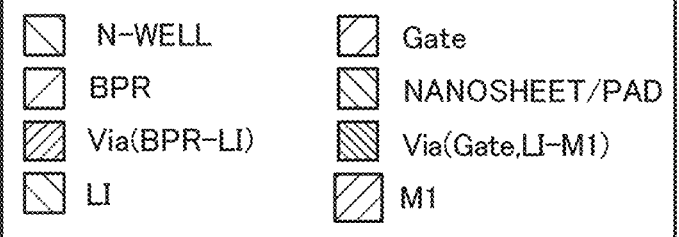

FIG.12

FIG.13A
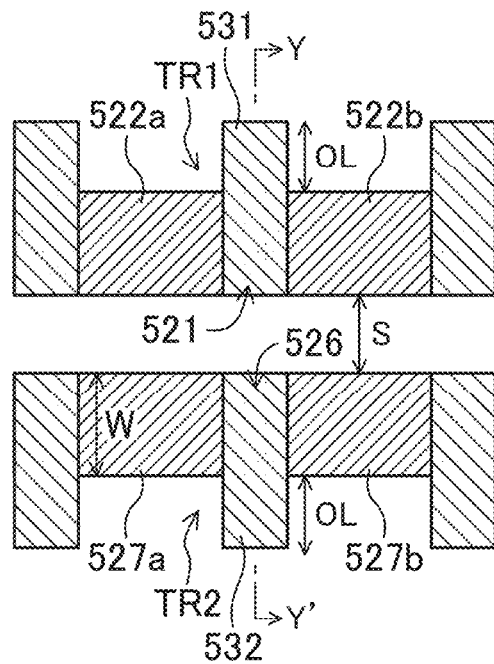
FIG.13B
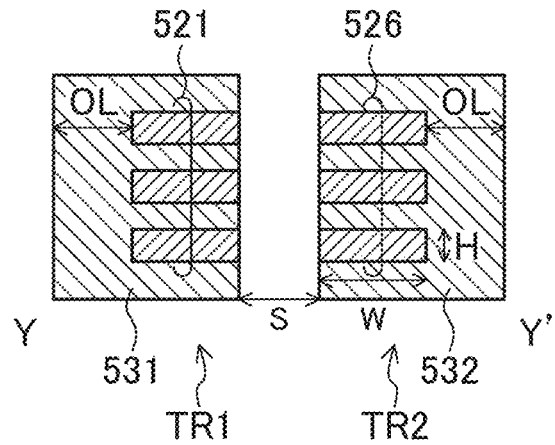
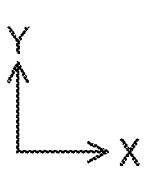
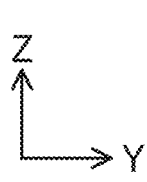
| | GATE INTERCONNECT |
| | DIFFUSION REGION |

SEMICONDUCTOR INTEGRATED CIRCUIT DEVICE

CROSS-REFERENCE TO RELATED APPLICATIONS

This application is a Continuation of U.S. patent application Ser. No. 17/889,106, filed on Aug. 16, 2022, which is a Continuation of International Patent Application No. PCT/JP2021/004379, filed on Feb. 5, 2021, which claims priority to Japanese Patent Application No. 2020-029453, filed on Feb. 25, 2020. The entire disclosures of these applications are incorporated by reference herein.

BACKGROUND

The present disclosure relates to a semiconductor integrated circuit device provided with nanosheet (nanowire) field effect transistors (FETs).

As a method for forming a semiconductor integrated circuit on a semiconductor substrate, a standard cell method is known. The standard cell method is a method in which basic units (e.g., inverters, latches, flipflops, and full adders) having specific logical functions are prepared in advance as standard cells, and a plurality of such standard cells are placed on a semiconductor substrate and connected through interconnects, thereby designing an LSI chip.

Also, as for transistors as basic constituents of an LSI, improvement in integration degree, reduction in operating voltage, and improvement in operating speed have been achieved thanks to scaling of the gate length. Recently, however, increase in off current due to excessive scaling and the resulting significant increase in power consumption have raised a problem. To solve this problem, three-dimensional transistors having a three-dimensional structure, changed from the conventional planar structure, have been vigorously studied. As one type of such three-dimensional transistors, nanosheet (nanowire) FETs have received attention.

P. Weckx et al., "Stacked nanosheet fork architecture for SRAM design and device co-optimization toward 3 nm," 2017 IEEE International Electron Devices Meeting (IEDM), December 2017, IEDM17-505-508 (Document 1) and P. Weckx et al., "Novel forksheet device architecture as ultimate logic scaling device towards 2 nm," 2019 IEEE International Electron Devices Meeting (IEDM), December 2019, IEDM19-871-874 (Document 2) disclose layouts of SRAM cells and standard cells using nanosheet FETs each having a gate electrode shaped like a fork.

Note that the nanosheet FET having a fork-shaped gate electrode is hereinafter called a forksheet FET following Document 1.

The recent progress toward further miniaturization and higher integration in semiconductor integrated circuits is significant. With this, decrease in operating voltage and increase in operating frequency are being accelerated. With the speedup, however, noise increases, and with the voltage reduction, noise immunity decreases, causing a problem that noise-caused circuit malfunctions tend to occur in recent semiconductor integrated circuits. As a method for preventing noise-caused circuit malfunctions, there is a method in which a decoupling capacitance is provided between power supplies of a circuit. A cell having such a decoupling capacitance is called a capacitive cell.

As of today, however, no examination has been made on a capacitive cell using forksheet FETs.

An objective of the present disclosure is providing a layout structure of a capacitive cell using forksheet FETs.

SUMMARY

According to the first mode of the present disclosure, a semiconductor integrated circuit device including a standard cell that is a capacitive cell is provided. The standard cell has a p-type region in which p-type transistors are formed and an n-type region in which n-type transistors are formed lying adjacent to each other in a first direction, and includes: a first nanosheet unit constituted by one nanosheet or two or more nanosheets arranged in the first direction, extending in a second direction vertical to the first direction in the p-type region; a second nanosheet unit constituted by one nanosheet or two or more nanosheets arranged in the first direction, extending in the second direction in the n-type region; a first gate interconnect extending in the first direction, formed to surround a periphery of the nanosheet of the first nanosheet unit in the first direction and a third direction perpendicular to the first and second directions; a first pair of pads each connected with each end of the nanosheet of the first nanosheet unit in the second direction; a second gate interconnect extending in the first direction, formed to surround a periphery of the nanosheet of the second nanosheet unit in the first direction and the third direction; and a second pair of pads each connected with each end of the nanosheet of the second nanosheet unit in the second direction, wherein the first pair of pads and the second gate interconnect are supplied with a first power supply voltage, and the second pair of pads and the first gate interconnect are supplied with a second power supply voltage lower than the first power supply voltage, and the first nanosheet unit and the second nanosheet unit are opposed to each other in the first direction, a nanosheet among the nanosheet of the first nanosheet unit closest to the second nanosheet unit is exposed from the first gate interconnect on a face opposed to the second nanosheet unit in the first direction, and a nanosheet among the nanosheet of the second nanosheet unit closest to the first nanosheet unit is exposed from the second gate interconnect on a face opposed to the first nanosheet unit in the first direction.

According to the above mode, since the first power supply voltage is supplied to the first pair of pads and the second gate interconnect and the second power supply voltage is supplied to the second pair of pads and the first gate interconnect, capacitances are produced between the first nanosheet unit and the first gate interconnect and between the second nanosheet unit and the second gate interconnect. In addition, capacitances are produced between the first gate interconnect and the second gate interconnect and between the first pair of pads and the second pair of pads. A nanosheet among the nanosheet of the first nanosheet unit closest to the second nanosheet unit is exposed from the first gate interconnect on its face opposed to the second nanosheet unit, and a nanosheet among the nanosheet of the second nanosheet unit closest to the first nanosheet unit is exposed from the second gate interconnect on its face opposed to the first nanosheet unit. Therefore, since the spacing between the first nanosheet unit and the second nanosheet unit can be reduced, the area of the capacitive cell can be made smaller. Also, larger capacitances can be secured between the first gate interconnect and the second gate interconnect and between the first pair of pads and the second pair of pads.

According to the second mode of the present disclosure, a semiconductor integrated circuit device including a standard cell that is a capacitive cell is provided. The standard cell has a first region in which transistors of a first-conductivity type are formed and a second region in which transistors of a second conductivity type are formed lying adjacent to each other in a first direction, and includes: a first nanosheet unit constituted by one nanosheet or two or more nanosheets arranged in the first direction, extending in a second direction vertical to the first direction in the first region; a second nanosheet unit constituted by one nanosheet or two or more nanosheets arranged in the first direction, extending in the second direction in the second region; a first gate interconnect extending in the first direction, formed to surround a periphery of the nanosheet of the first nanosheet unit in the first direction and a third direction perpendicular to the first and second directions; a first pair of pads each connected with each end of the nanosheet of the first nanosheet unit in the second direction; a second gate interconnect extending in the first direction, formed to surround a periphery of the nanosheet of the second nanosheet unit in the first direction and the third direction; and a second pair of pads each connected with each end of the nanosheet of the second nanosheet unit in the second direction, the first and second gate interconnects are supplied with a first power supply voltage, and the first and second pairs of pads are supplied with a second power supply voltage different from the first power supply voltage, and the first nanosheet unit and the second nanosheet unit are opposed to each other in the first direction, a nanosheet among the nanosheet of the first nanosheet unit closest to the second nanosheet unit is exposed from the first gate interconnect on a face opposed to the second nanosheet unit in the first direction, and a nanosheet among the nanosheet of the second nanosheet unit closest to the first nanosheet unit is exposed from the second gate interconnect on a face opposed to the first nanosheet unit in the first direction.

According to the above mode, since the first power supply voltage is supplied to the first and second gate interconnects and the second power supply voltage is supplied to the first and second pairs of pads, capacitances are produced between the first nanosheet unit and the first gate interconnect and between the second nanosheet unit and the second gate interconnect. A nanosheet among the nanosheet of the first nanosheet unit closest to the second nanosheet unit is exposed from the first gate interconnect on its face opposed to the second nanosheet unit, and a nanosheet among the nanosheet of the second nanosheet unit closest to the first nanosheet unit is exposed from the second gate interconnect on its face opposed to the first nanosheet unit. Therefore, since the spacing between the first nanosheet unit and the second nanosheet unit can be reduced, the area of the capacitive cell can be made smaller.

According to the present disclosure, a layout structure of a large-capacity capacitive cell using forksheet FETs can be implemented.

BRIEF DESCRIPTION OF THE DRAWINGS

FIGS. 5A-5B are cross-sectional views of a layout structure of a capacitive cell according to an alteration of the first embodiment.

FIG. 12 is a circuit diagram of the capacitive cell shown in FIG. 11.

FIGS. 13A and 13B are views showing a basic structure of a forksheet FET, where

FIG. 13A is a plan view and FIG. 13B is a cross-sectional view.

DETAILED DESCRIPTION

Figure 1:
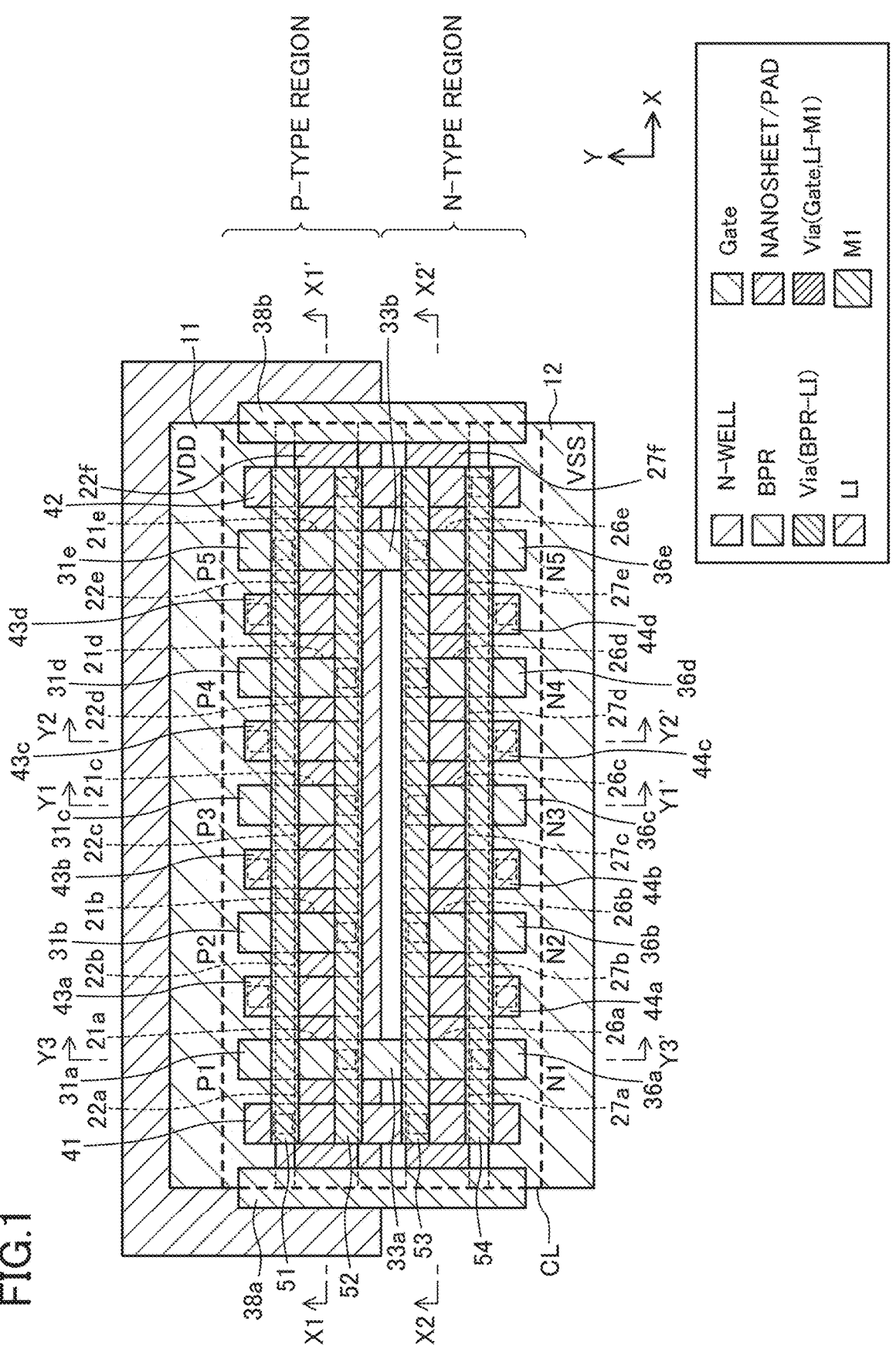
FIG. 1 is a plan view showing a layout structure of a capacitive cell according to the first embodiment.

Embodiments of the present disclosure will be described hereinafter with reference to the accompanying drawings. In the following embodiments, it is assumed that the semiconductor integrated circuit device includes a plurality of standard cells (hereinafter simply called cells as appropriate), and at least some of the standard cells include forksheet field effect transistors (FETs). The nanosheet FET is a FET using a thin sheet (nanosheet) through which a current flows. Such a nanosheet is formed of silicon, for example. In the semiconductor integrated circuit device, it is assumed that some of the nanosheet FETs are forksheet FETs each having a fork-shaped gate electrode.

In the present disclosure, a semiconductor layer portion formed on each end of a nanosheet to constitute a terminal that is to be the source or drain of a nanosheet FET is called a "pad."

First, the basic structure of a forksheet FET will be described.

FIGS. 13A-13B are views showing a basic structure of a forksheet FET, where FIG. 13A is a plan view and FIG. 13B is a cross-sectional view taken along line Y-Y' in FIG. 13A. In the basic structure of FIGS. 13A-13B, two transistors TR1 and TR2 are placed side by side with space S between them in the Y direction. A gate interconnect 531 that is to be the gate of the transistor TR1 and a gate interconnect 532 that is to be the gate of the transistor TR2 extend in the Y direction and are at the same position in the X direction.

A channel portion 521 that is to be the channel region of the transistor TR1 and a channel portion 526 that is to be the channel region of the transistor TR2 are constituted by nanosheets. In FIGS. 13A-13B, the channel portions 521 and 526 are each constituted by a stacked structure of three nanosheets overlapping as viewed in plan. Pads 522a and 522b that are to be the source and drain regions of the transistor TR1 are formed on both sides of the channel portion 521 in the X direction. Pads 527a and 527b that are to be the source and drain regions of the transistor TR2 are formed on both sides of the channel portion 526 in the X direction. The pads 522a and 522b are formed by epitaxial growth from the nanosheets constituting the channel portion 521. The pads 527a and 527b are formed by epitaxial growth from the nanosheets constituting the channel portion 526.

The gate interconnect 531 surrounds the peripheries of the nanosheets constituting the channel portion 521 in the Y and Z directions via gate insulating films (not shown). Note however that the faces of the nanosheets constituting the channel portion 521 on the side closer to the transistor TR2 in the Y direction are exposed, not covered with the gate interconnect 531. That is, in the cross-sectional view of FIG. 13B, the gate interconnect 531 does not cover the right side faces of the nanosheets constituting the channel portion 521 but covers the upper, lower, and left side faces of the nanosheets. The gate interconnect 531 protrudes from the nanosheets constituting the channel portion 521 by a length OL toward the side away from the transistor TR2 in the Y direction.

The gate interconnect 532 surrounds the peripheries of the nanosheets constituting the channel portion 526 in the Y and Z directions via gate insulating films (not shown). Note however that the faces of the nanosheets constituting the channel portion 526 on the side closer to the transistor TR1 in the Y direction are exposed, not covered with the gate interconnect 532. That is, in the cross-sectional view of FIG. 13B, the gate interconnect 532 does not cover the left side faces of the nanosheets constituting the channel portion 526 but covers the upper, lower, and right side faces of the nanosheets. The gate interconnect 532 protrudes from the nanosheets constituting the channel portion 526 by a length OL toward the side away from the transistor TR1 in the Y direction.

Here, the gate effective width Weff of each nanosheet is represented by $$Weff = 2 \times W + H$$

where W is the width (size in the Y direction) of the nanosheet, and H is the height (size in the Z direction) thereof. Since the channel portions 521 and 526 of the transistors TR1 and TR2 are each constituted by three nanosheets, the gate effective width of each of the transistors TR1 and TR2 is $$3 \times (2 \times W + H).$$

In the structure of FIGS. 13A-13B, the gate interconnect 531 does not protrude from the nanosheets constituting the channel portion 521 toward the transistor TR2 in the Y direction. Also, the gate interconnect 532 does not protrude from the nanosheets constituting the channel portion 526 toward the transistor TR1 in the Y direction. This can bring the transistors TR1 and TR2 closer to each other and thus achieve area reduction.

The number of nanosheets constituting the channel portion of each transistor is not limited to three. The channel portion may be constituted by one nanosheet, or may be constituted by a stacked structure of a plurality of nanosheets overlapping as viewed in plan. Also, while the cross-sectional shape of the nanosheets is illustrated as rectangular in FIG. 13B, it is not limited to this. For example, the shape may be square, circular, or oval.

The semiconductor storage device may include both forksheet FETs and other nanosheet FETs where a gate interconnect surrounds the entire peripheries of nanosheets, in a mixed manner.

As used herein, "VDD" and "VSS" refer to the power supply voltages or the power supplies themselves. Also, as used herein, an expression indicating that sizes such as widths are identical, like the "same wiring width," is to be understood as including a range of manufacturing variations.

First Embodiment

Figure 2:
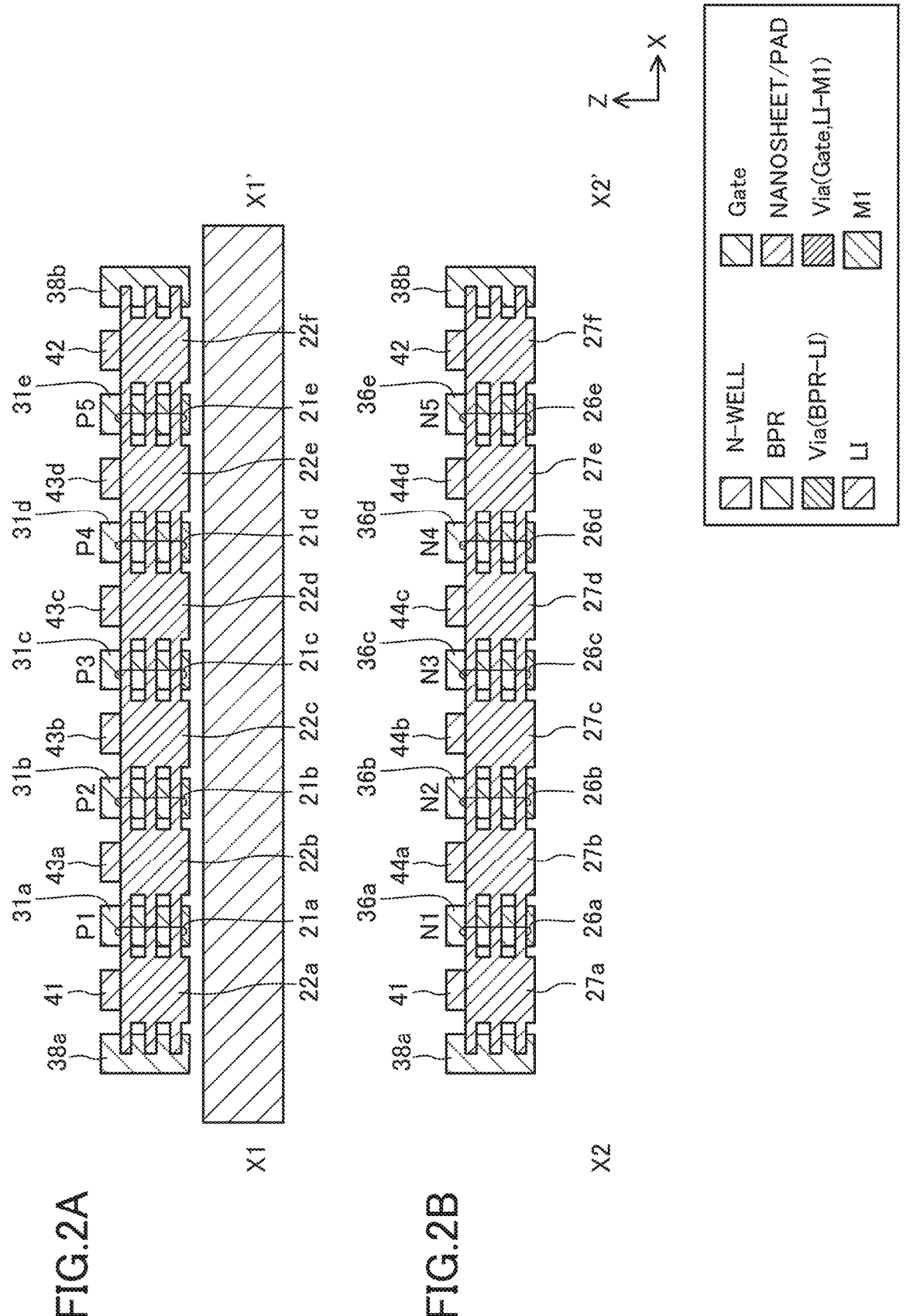
FIGS. 2A-2B are cross-sectional views of the layout structure of FIG. 1 taken horizontally as viewed in plan.
Figure 3:
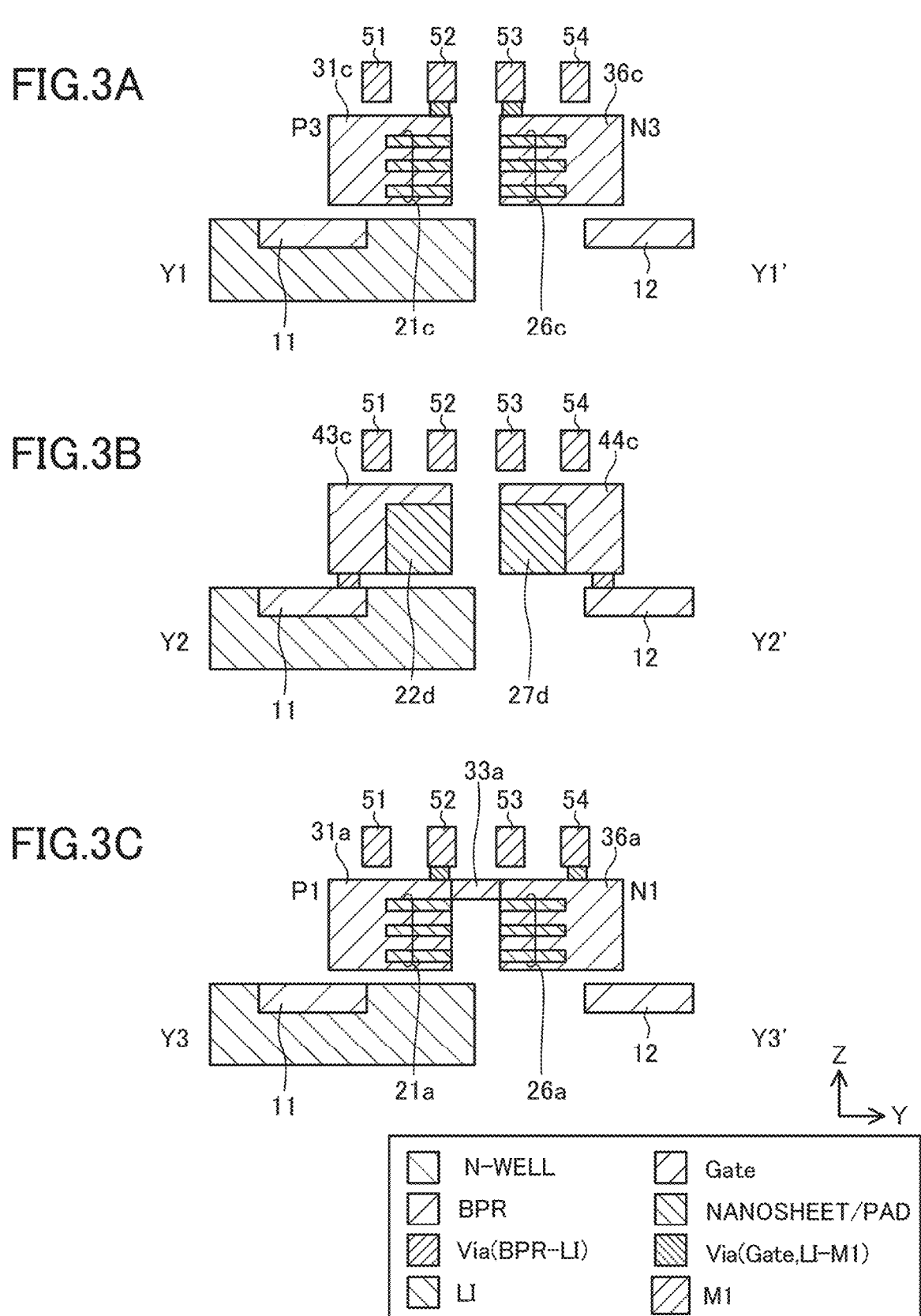
FIGS. 3A-3C are cross-sectional views of the layout structure of FIG. 1 taken vertically as viewed in plan.

FIGS. 1, 2A-2B, and 3A-3C are views showing a layout structure of a capacitive cell according to the first embodiment, where FIG. 1 is a plan view, FIGS. 2A-2B are cross-sectional views taken horizontally as viewed in plan, and FIGS. 3A-3C are cross-sectional views taken vertically as viewed in plan. Specifically, FIG. 2A shows a cross section taken along line X1-X1', FIG. 2B shows a cross section taken along line X2-X2', FIG. 3A shows a cross section taken along line Y1-Y1', FIG. 3B shows a cross section taken along line Y2-Y2', and FIG. 3C shows a cross section taken along line Y3-Y3'.

Note that, in the plan views such as FIG. 1, the horizontal direction in the figure is hereinafter referred to as an X direction (corresponding to the second direction), the vertical direction in the figure as a Y direction (corresponding to the first direction), and the direction perpendicular to the substrate plane as a Z direction (corresponding to the third direction).

Figure 4:
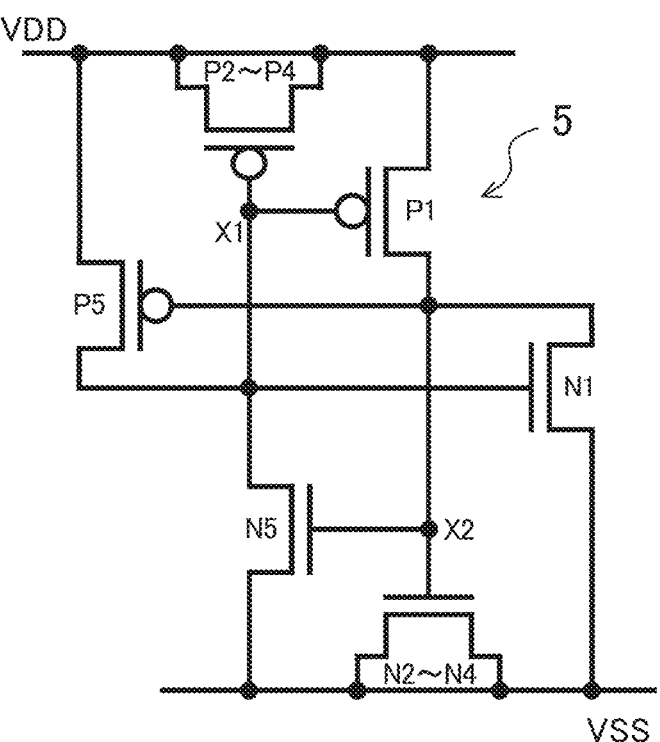
FIG. 4 is a circuit diagram of the capacitive cell shown in FIGS. 1, 2A-2B, and 3A-3C.

FIG. 4 is a circuit diagram of the capacitive cell shown in FIGS. 1, 2A-2B, and 3A-3C. As shown in FIG. 4, the capacitive cell has p-type transistors P1, P2, P3, P4, and P5 and n-type transistors N1, N2, N3, N4, and N5. The transistors P2 to P4 and the transistors N2 to N4 function as capacitances. The transistor P1 and the transistor N5 constitute a fixed value output unit 5. The fixed value output unit 5 outputs a low fixed value (VSS) to a node X1 and a high fixed value (VDD) to a node X2. The transistor P1 is connected to VDD at its source, to the gate of the transistor N5 at its drain, and to the drain of the transistor N5 at its gate. The transistor N5 is connected to VSS at its source and to the gate of the transistor P1 at its drain. The gate of the transistor P1 corresponds to the node X1, and the gate of the transistor N5 corresponds to the node X2.

The transistors P5 and N1 are off-state transistors. Although the transistors P5 and N1 are not necessarily required for the circuit configuration of the capacitive cell, the presence of these transistors improves the regularity of the layout of the capacitive cell, which improves the ease of device manufacture, improves the yield, and reduces manufacturing variations.

The transistors P2 to P4 are connected to VDD at their sources and drains and to the node X1 at their gates. Since VSS is output to the node X1 from the fixed value output unit 5, the transistors P2 to P4 function as capacitances. The transistors N2 to N4 are connected to VSS at their sources and drains and to the node X2 at their gates. Since VDD is output to the node X2 from the fixed value output unit 5, the transistors N2 to N4 function as capacitances.

The capacitive cell of FIGS. 1, 2A-2B, and 3A-3C and other standard cells are arranged in a row in the X direction with cell limits CL of each cell in touch with adjacent ones, thereby constituting a cell row. A plurality of such cell rows are arranged in the Y direction with cell limits CL in touch with adjacent ones. Note that such cell rows are inverted vertically every other row.

As shown in FIG. 1, power lines 11 and 12 extending in the X direction are provided along both ends of the capacitive cell in the Y direction. The power lines 11 and 12 are both buried power rails (BPR) formed in a buried interconnect layer. The power line 11 supplies the power supply voltage VDD, and the power line 12 supplies the power supply voltage VSS. The power lines 11 and 12 are shared with other cells in the cell row including this capacitive cell, serving as power lines extending in the X direction. Also, the power lines 11 and 12 each serve as a power line provided astride the cell rows adjacent in the Y direction.

The p-type transistors P1, P2, P3, P4, and P5 are formed in a p-type region on an N-well, and the n-type transistors N1, N2, N3, N4, and N5 are formed in an n-type region on a P-substrate. The p-type region and the n-type region are adjacent to each other in the Y direction. The positions of the transistors P1, P2, P3, P4, and P5 are the same as the positions of the transistors N1, N2, N3, N4, and N5, respectively, in the X direction. That is, the transistors P1 and N1 are placed in line in the Y direction, the transistors P2 and N2 are placed in line in the Y direction, the transistors P3 and N3 are placed in line in the Y direction, the transistors P4 and N4 are placed in line in the Y direction, and the transistors P5 and N5 are placed in line in the Y direction.

The transistors P1, P2, P3, P4, and P5 have nanosheets 21a, 21b, 21c, 21d, and 21e, respectively, each having three stacked sheets overlapping as viewed in plan, as channel portions. That is, the transistors P1, P2, P3, P4, and P5 are nanosheet FETs.

As shown in FIG. 1, pads 22a, 22b, 22c, 22d, 22e, and 22f, each formed of an integral semiconductor layer connected to the stacked structure of three sheets, are formed on the left side of the nanosheets 21a in the figure, between the nanosheets 21a and 21b, between the nanosheets 21b and 21c, between the nanosheets 21c and 21d, between the nanosheets 21d and 21e, and on the right side of the nanosheet 21e in the figure, respectively. The pads 22a and 22b are to be the source region and drain region of the transistor P1, the pads 22b and 22c are to be the source region and drain region of the transistor P2, the pads 22c and 22d are to be the source region and drain region of the transistor P3, the pads 22d and 22e are to be the source region and drain region of the transistor P4, and the pads 22e and 22f are to be the source region and drain region of the transistor P5.

The transistors N1, N2, N3, N4, and N5 have nanosheets 26a, 26b, 26c, 26d, and 26e, respectively, each having three stacked sheets overlapping as viewed in plan, as channel portions. That is, the transistors N1, N2, N3, N4, and N5 are nanosheet FETs.

As shown in FIG. 1, pads 27a, 27b, 27c, 27d, 27e, and 27f, each formed of an integral semiconductor layer connected to the stacked structure of three sheets, are formed on the left side of the nanosheets 26a in the figure, between the nanosheets 26a and 26b, between the nanosheets 26b and 26c, between the nanosheets 26c and 26d, between the nanosheets 26d and 26e, and on the right side of the nanosheet 26e in the figure, respectively. The pads 27a and 27b are to be the source region and drain region of the transistor N1, the pads 27b and 27c are to be the source region and drain region of the transistor N2, the pads 27c and 27d are to be the source region and drain region of the transistor N3, the pads 27d and 27e are to be the source region and drain region of the transistor N4, and the pads 27f are to be the source region and drain region of the transistor N5.

Gate interconnects 31a, 31b, 31c, 31d, and 31e extending in parallel in the Y direction are formed in the p-type region. The gate interconnects 31a, 31b, 31c, 31d, and 31e have the same width and are placed at the same pitch. Gate interconnects 36a, 36b, 36c, 36d, and 36e extending in parallel in the Y direction are formed in the n-type region. The gate interconnects 36a, 36b, 36c, 36d, and 36e have the same width and are placed at the same pitch. The positions of the gate interconnects 31a, 31b, 31c, 31d, and 31e are the same as the positions of the gate interconnects 36a, 36b, 36c, 36d, and 36e, respectively, in the X direction. That is, the gate interconnects 31a and 36a are placed in line in the Y direction, the gate interconnects 31b and 36b are placed in line in the Y direction, the gate interconnects 31c and 36c are placed in line in the Y direction, the gate interconnects 31d and 36d are placed in line in the Y direction, and the gate interconnects 31e and 36e are placed in line in the Y direction. Dummy gate interconnects 38a and 38b are formed on the cell limits CL on both sides in the X direction.

The gate interconnect 31a surrounds the peripheries of the nanosheets 21a of the transistor P1 in the Y and Z directions through gate insulating films (not shown). The gate interconnect 31a is to be the gate of the transistor P1. Similarly, the gate interconnects 31b, 31c, 31d, and 31e surround the peripheries of the nanosheets 21b, 21c, 21d, and 21e of the transistors P2, P3, P4, and P5, respectively, in the Y and Z directions through gate insulating films (not shown). The gate interconnects 31b, 31c, 31d, and 31e are to be the gates of the transistors P2, P3, P4, and P5, respectively.

The gate interconnect 36a surrounds the peripheries of the nanosheets 26a of the transistor N1 in the Y and Z directions through gate insulating films (not shown). The gate interconnect 36a is to be the gate of the transistor N1. Similarly, the gate interconnects 36b, 36c, 36d, and 36e surround the peripheries of the nanosheets 26b, 26c, 26d, and 26e of the transistors N2, N3, N4, and N5, respectively, in the Y and Z directions through gate insulating films (not shown). The gate interconnects 36b, 36c, 36d, and 36e are to be the gates of the transistors N2, N3, N4, and N5, respectively.

The gate interconnects 31a and 36a placed side by side in the Y direction are mutually connected through a bridge 33a formed between the gate interconnects 31a and 36a. The gate interconnects 31e and 36e placed side by side in the Y direction are mutually connected through a bridge 33b formed between the gate interconnects 31e and 36e.

Local interconnects 41, 42, 43a, 43b, 43c, 43d, 44a, 44b, 44c, and 44d extending in the Y direction are formed in a local interconnect layer. The local interconnect 41 is connected with the pads 22a and 27a, and the local interconnect 42 is connected with the pads 22f and 27f. The local interconnects 43a, 43b, 43c, and 43d are connected with the pads 22b, 22c, 22d, and 22e, respectively, and also connected with the power line 11 through vias. The local interconnects 44a, 44b, 44c, and 44d are connected with the pads 27b, 27c, 27d, and 27e, respectively, and also connected with the power line 12 through vias.

Metal interconnects 51, 52, 53, and 54 extending in the X direction are formed in an M1 interconnect layer. The metal interconnects 52 and 54 correspond to the node X1 of the circuit, and the metal interconnects 51 and 53 correspond to the node X2 of the circuit. The metal interconnect 51 is connected with the gate interconnect 31e through a via and also connected with the local interconnect 41 through a via. The metal interconnect 52 is connected with the gate interconnects 31a, 31b, 31c, and 31d through vias and also connected with the local interconnect 42 through a via. The metal interconnect 53 is connected with the gate interconnects 36b, 36c, 36d, and 36e through vias and also connected with the local interconnect 41 through a via. The metal interconnect 54 is connected with the gate interconnect 36a through a via and also connected with the local interconnect 42 through a via. The metal interconnects 51, 52, 53, and 54 form wiring capacitances.

The nanosheets 21a and the nanosheets 26a are opposed to each other in the Y direction. The faces of the nanosheets 21a closer to the nanosheets 26a in the Y direction are exposed, not covered with the gate interconnect 31a. The faces of the nanosheets 26a closer to the nanosheets 21a in the Y direction are exposed, not covered with the gate interconnect 36a.

Similarly, the nanosheets 21b and the nanosheets 26b are opposed to each other in the Y direction, the nanosheets 21c and the nanosheets 26c are opposed to each other in the Y direction, the nanosheets 21d and the nanosheets 26d are opposed to each other in the Y direction, and the nanosheets 21e and the nanosheets 26e are opposed to each other in the Y direction. The faces of the nanosheets 21b, 21c, 21d, and 21e closer to the nanosheets 26b, 26c, 26d, and 26e, respectively, in the Y direction are exposed, not covered with the gate interconnects 31b, 31c, 31d, and 31e, respectively. The faces of the nanosheets 26b, 26c, 26d, and 26e closer to the nanosheets 21b, 21c, 21d, and 21e, respectively, in the Y direction are exposed, not covered with the gate interconnects 36b, 36c, 36d, and 36e, respectively.

Here, focus on the transistor P3 functioning as a capacitance. In the transistor P3, VSS is supplied to the gate interconnect 31c that is to be its gate from the node X1, and VDD is supplied to the pads 22c and 22d that are to be its source and drain through the local interconnects 43b and 43c. This produces capacitances via gate oxide films of the transistor P3. Also, capacitances are produced at the following positions:

1) between the pads 22c and 22d and the gate interconnect 31c (see FIG. 2A);

2) between the local interconnects 43b and 43c and the gate interconnect 31c (see FIG. 2A);

3) between the gate interconnect 31c and the gate interconnect 36c of the transistor N3 (see FIG. 3A) (VDD is supplied to the gate interconnect 36c from the node X2);

4) between the pads 22c and 22d and the pads 27c and 27d of the transistor N3 (see FIG. 3B) (VSS is supplied to the pads 27c and 27d through the local interconnects 44b and 44c); and 5) between the local interconnects 43b and 43c and the local interconnects 44b and 44c (see FIG. 3B).

In this embodiment, the faces of the nanosheets 21c of the transistor P3 closer to the nanosheets 26c of the transistor N3 are not covered with the gate interconnect 31c, and the faces of the nanosheets 26c of the transistor N3 closer to the nanosheets 21c of the transistor P3 are not covered with the gate interconnect 36c. This reduces the distance between the transistor P3 and the transistor N3, and therefore increases the capacitances 3) and 4) above.

As described above, in this embodiment, in the transistors P2, P3, and P4, capacitances are produced between the nanosheets 21b, 21c, and 21d and the gate interconnects 31b, 31c, and 31d. In the transistors N2, N3, and N4, capacitances are produced between the nanosheets 26b, 26c, and 26d and the gate interconnects 36b, 36c, and 36d. Also, the faces of the nanosheets 21b, 21c, and 21d closer to the nanosheets 26b, 26c, and 26d are exposed from the gate interconnects 31b, 31c, and 31d, and the faces of the nanosheets 26b, 26c, and 26d closer to the nanosheets 21b, 21c, and 21d are exposed from the gate interconnects 36b, 36c, and 36d. Therefore, since the spacing between the nanosheets 21b, 21c, and 21d and the nanosheets 26b, 26c, and 26d can be reduced, the area of the capacitive cell can be made smaller. In addition, in the transistors P3 and N3, for example, larger capacitances can be secured between the gate interconnect 31c and the gate interconnect 36c and between the pair of pads 22c and 22d and the pair of pads 27c and 27d.

In this embodiment, the fixed value output unit may be omitted. In this case, the capacitive cell may be configured so as to supply VSS directly to the gates of the transistors P2, P3, and P4 and supply VDD directly to the gates of the transistors N2, N3, and N4, for example. Also, while three p-type transistors and three n-type transistors are provided to constitute the capacitance in this embodiment, the number of transistors constituting the capacitance is not limited to this.

(Alteration)

While each transistor includes one stack of nanosheets placed singly in the Y direction in the above embodiment, each transistor may include two or more stacks of nanosheets placed in the Y direction. In this case, it is only necessary for nanosheets opposed to each other at the boundary of the p-type region and the n-type region to be exposed from the corresponding gate interconnects. That is, assuming that the nanosheets of a p-type transistor constitute a first nanosheet unit and the nanosheets of an n-type transistor constitute a second nanosheet unit, the followings are only necessary. That is, among the nanosheets of the first nanosheet unit, nanosheets closest to the second nanosheet unit are exposed from the corresponding gate interconnect on their faces opposed to the second nanosheet unit in the Y direction. Among the nanosheets of the second nanosheet unit, nanosheets closest to the first nanosheet unit are exposed from the corresponding gate interconnect on their faces opposed to the first nanosheet unit in the Y direction. With this, similar effects to those obtained in the above embodiment are obtained.

FIGS. 5A and 5B are cross-sectional views taken vertically as viewed in plan, showing a configuration of an alteration of this embodiment. In the configuration of FIGS. 5A-5B, the transistor P3 has two stacks of nanosheets 21c and 23c arranged side by side in the Y direction, and the transistor N3 has two stacks of nanosheets 26c and 28c arranged side by side in the Y direction. On one side of the nanosheets 21c, 23c, 26c, and 28c in the X direction, pads 22d, 24d, 27d, and 29d are formed respectively.

The faces of the nanosheets 21c opposed to the nanosheets 26c in the Y direction are exposed, not covered with the gate interconnect 31c. The faces of the nanosheets 26c opposed to the nanosheets 21c in the Y direction are exposed, not covered with the gate interconnect 36c.

That is, assuming that the nanosheets 21c and 23c constitute a first nanosheet unit 24 and the nanosheets 26c and 28c constitute a second nanosheet unit 25, among the nanosheets of the first nanosheet unit 24, the nanosheets 21c closest to the second nanosheet unit 25 are exposed from the gate interconnect 31c on their faces opposed to the second nanosheet unit 25 in the Y direction. Among the nanosheets of the second nanosheet unit 25, the nanosheets 26c closest to the first nanosheet unit 24 are exposed from the gate interconnect 36c on their faces opposed to the first nanosheet unit 24 in the Y direction.

Second Embodiment

Figure 6:
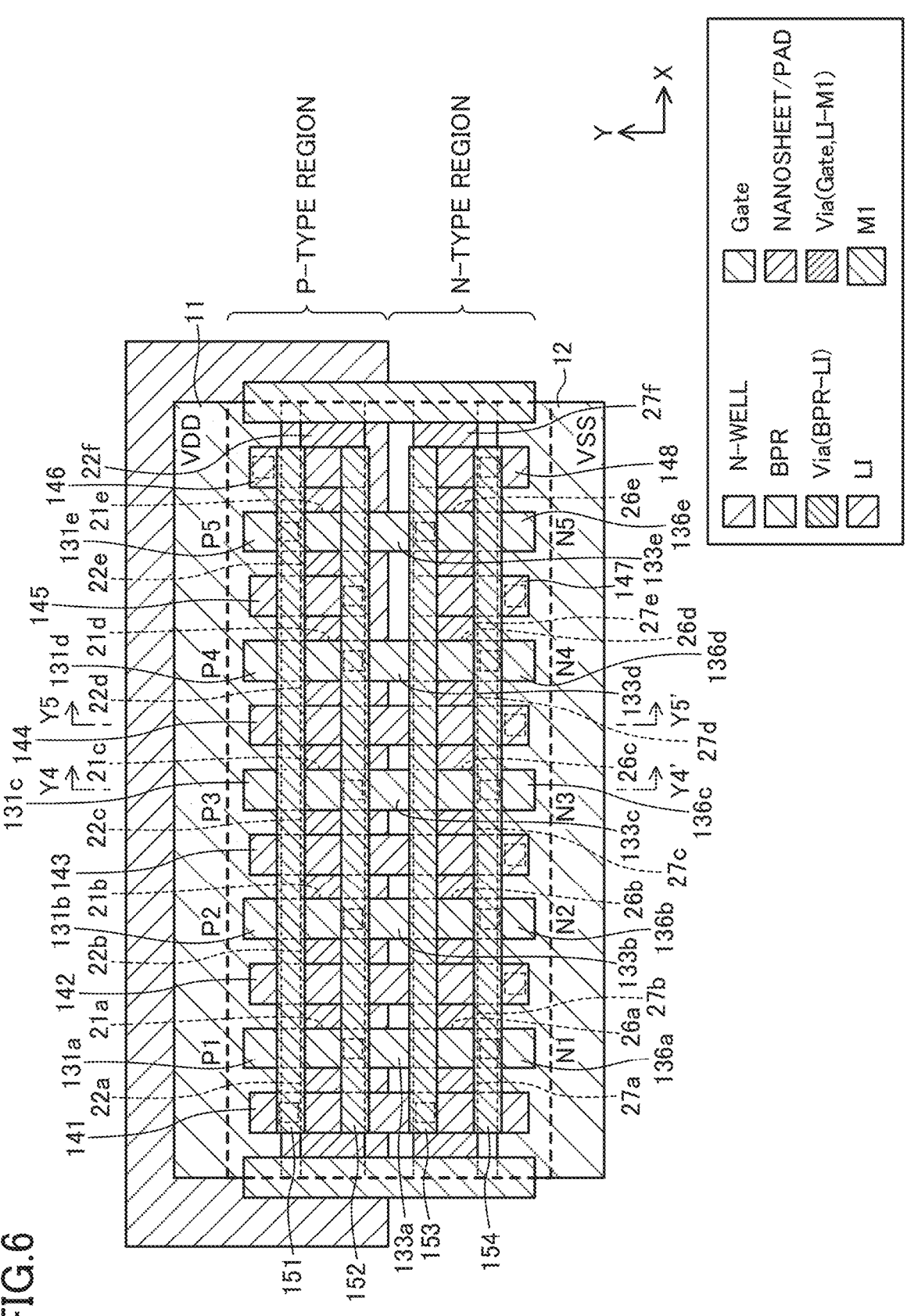
FIG. 6 is a plan view showing a layout structure of a capacitive cell according to the second embodiment.
Figure 7A:
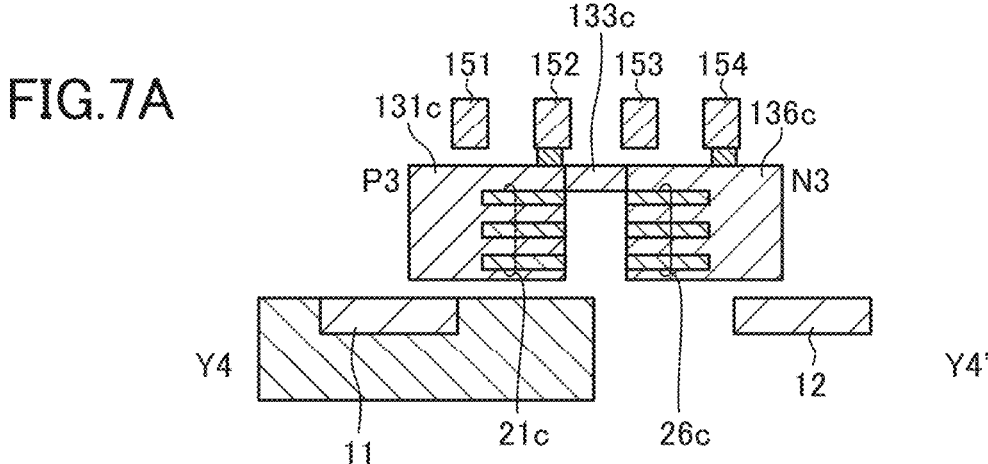
FIGS. 7A-7B are cross-sectional views of the layout structure of FIG. 6 taken vertically as viewed in plan.
Figure 7B:
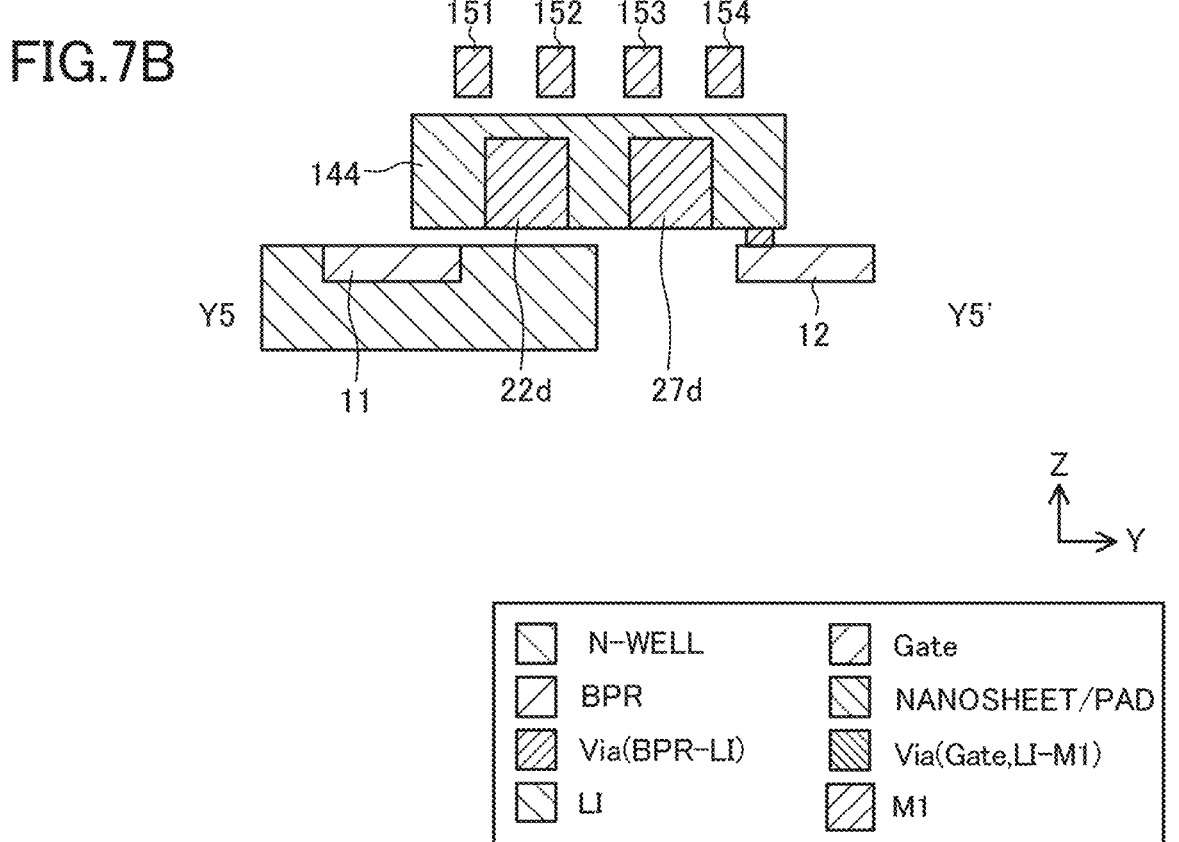

FIGS. 6 and 7A-7B are views showing a layout structure of a capacitive cell according to the second embodiment, where FIG. 6 is a plan view and FIGS. 7A-7B are cross-sectional views taken vertically as viewed in plan. Specifically, FIG. 7A shows a cross section taken along line Y4-Y4' and FIG. 7B shows a cross section taken along line Y5-Y5'. The layout structure shown in FIGS. 6 and 7A-7B resembles the layout structure shown in FIGS. 1, 2A-2B, and 3A-3C: e.g., the placement of the power lines and the nanosheets and pads of the transistors is similar. In the following description, therefore, description of similar components to those in the first embodiment will be omitted in some cases.

Figure 8:
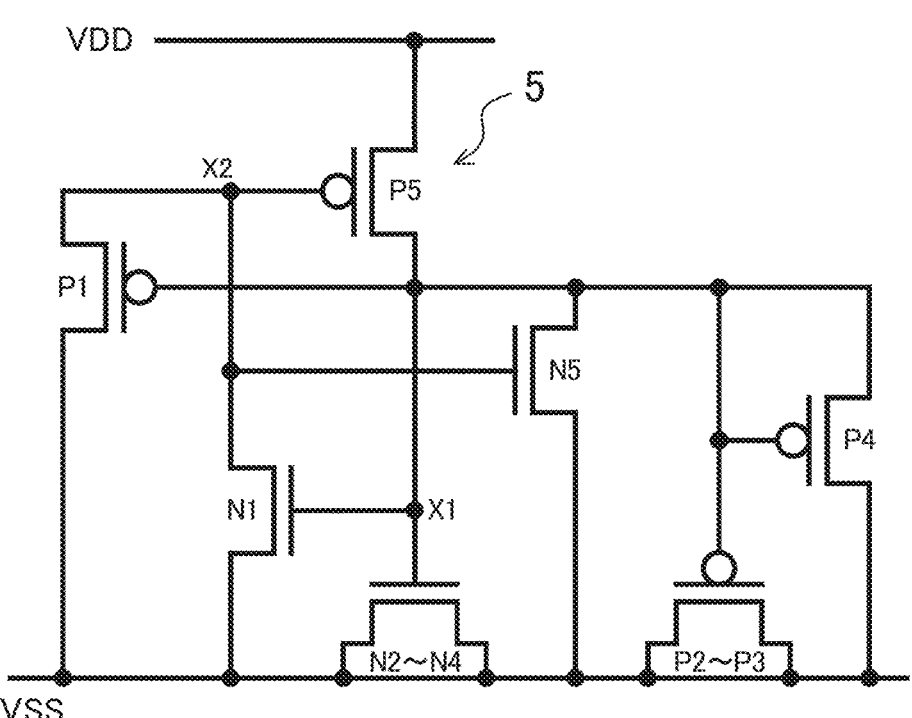
FIG. 8 is a circuit diagram of the capacitive cell shown in FIGS. 6 and 7A-7B.

FIG. 8 is a circuit diagram of the capacitive cell shown in FIGS. 6 and 7A-7B. As shown in FIG. 8, the capacitive cell has p-type transistors P1, P2, P3, P4, and P5 and n-type transistors N1, N2, N3, N4, and N5. The transistors N2 to N4 function as capacitances. The transistor P5 and the transistor N1 constitute a fixed value output unit 5. The fixed value output unit 5 outputs a high fixed value (VDD) to a node X1 and a low fixed value (VSS) to a node X2. The transistor P5 is connected to VDD at its source, to the gate of the transistor N1 at its drain, and to the drain of the transistor N1 at its gate. The transistor N1 is connected to VSS at its source and to the gate of the transistor P5 at its drain. The gate of the transistor N1 corresponds to the node X1, and the gate of the transistor P5 corresponds to the node X2.

The transistors P1 to P4 and the transistor N5 are off-state transistors. Although the transistors P1 to P4 and the transistor N5 are not necessarily required for the circuit configuration of the capacitive cell, the presence of these transistors improves the regularity of the layout of the capacitive cell, which improves the ease of device manufacture, improves the yield, and reduces manufacturing variations.

The transistors N2 to N4 are connected to VSS at their sources and drains and to the node X1 at their gates. Since VDD is output to the node X1 from the fixed value output unit 5, the transistors N2 to N4 function as capacitances.

As shown in FIGS. 6 and 7A-7B, gate interconnects 131a, 131b, 131c, 131d, and 131e extending in parallel in the Y direction are formed in the p-type region. The gate interconnects 131a, 131b, 131c, 131d, and 131e have the same width and are placed at the same pitch. Gate interconnects 136a, 136b, 136c, 136d, and 136e extending in parallel in the Y direction are formed in the n-type region. The gate interconnects 136a, 136b, 136c, 136d, and 136e have the same width and are placed at the same pitch. The positions of the gate interconnects 131a, 131b, 131c, 131d, and 131e are the same as the positions of the gate interconnects 136a, 136b, 136c, 136d, and 136e, respectively, in the X direction. That is, the gate interconnects 131a and 136a are placed in line in the Y direction, the gate interconnects 131b and 136b are placed in line in the Y direction, the gate interconnects 131c and 136c are placed in line in the Y direction, the gate interconnects 131d and 136d are placed in line in the Y direction, and the gate interconnects 131e and 136e are placed in line in the Y direction.

The gate interconnect 131a surrounds the peripheries of the nanosheets 21a of the transistor P1 in the Y and Z directions through gate insulating films (not shown). The gate interconnect 131a is to be the gate of the transistor P1. Similarly, the gate interconnects 131b, 131c, 131d, and 131e surround the peripheries of the nanosheets 21b, 21c, 21d, and 21e of the transistors P2, P3, P4, and P5, respectively, in the Y and Z directions through gate insulating films (not shown). The gate interconnects 131b, 131c, 131d, and 131e are to be the gates of the transistors P2, P3, P4, and P5, respectively.

The gate interconnect 136a surrounds the peripheries of the nanosheets 26a of the transistor N1 in the Y and Z directions through gate insulating films (not shown). The gate interconnect 136a is to be the gate of the transistor N1. Similarly, the gate interconnects 136b, 136c, 136d, and 136e surround the peripheries of the nanosheets 26b, 26c, 26d, and 26e of the transistors N2, N3, N4, and N5, respectively, in the Y and Z directions through gate insulating films (not shown). The gate interconnects 136b, 136c, 136d, and 136e are to be the gates of the transistors N2, N3, N4, and N5, respectively.

The gate interconnects 131a and 136a placed side by side in the Y direction are mutually connected through a bridge 133a formed between the gate interconnects 131a and 136a. The gate interconnects 131b and 136b placed side by side in the Y direction are mutually connected through a bridge 133b formed between the gate interconnects 131b and 136b. The gate interconnects 131c and 136c placed side by side in the Y direction are mutually connected through a bridge 133c formed between the gate interconnects 131c and 136c. The gate interconnects 131d and 136d placed side by side in the Y direction are mutually connected through a bridge 133d formed between the gate interconnects 131d and 136d. The gate interconnects 131e and 136e placed side by side in the Y direction are mutually connected through a bridge 133e formed between the gate interconnects 131e and 136e.

Local interconnects 141, 142, 143, 144, 145, 146, 147, and 148 extending in the Y direction are formed in a local interconnect layer. The local interconnect 141 is connected with the pads 22a and 27a. The local interconnect 142 is connected with the pads 22b and 27b and also connected with the power line 12 through a via. The local interconnect 143 is connected with the pads 22c and 27c and also connected with the power line 12 through a via. The local interconnect 144 is connected with the pads 22d and 27d and also connected with the power line 12 through a via. The local interconnect 145 is connected with the pad 22e. The local interconnect 146 is connected with the pad 22f and also connected with the power line 11 through a via. The local interconnect 147 is connected with the pad 27e and also connected with the power line 12 through a via. The local interconnect 148 is connected with the pad 27f. Metal interconnects 151, 152, 153, and 154 extending in the X direction are formed in an M1 interconnect layer. The metal interconnects 152 and 154 correspond to the node X1 of the circuit, and the metal interconnects 151 and 153 correspond to the node X2 of the circuit. The metal interconnect 151 is connected with the gate interconnect 131e through a via and also connected with the local interconnect 141 through a via. The metal interconnect 152 is connected with the gate interconnects 131a, 131b, 131c, and 131d through vias and also connected with the local interconnect 145 through a via. The metal interconnect 153 is connected with the gate interconnect 136e through a via and also connected with the local interconnect 141 through a via. The metal interconnect 154 is connected with the gate interconnects 136a, 136b, 136c, and 136d through vias and also connected with the local interconnect 148 through a via.

As in the first embodiment, the nanosheets 21a and the nanosheets 26a are opposed to each other in the Y direction. The faces of the nanosheets 21a closer to the nanosheets 26a in the Y direction are exposed, not covered with the gate interconnect 131a. The faces of the nanosheets 26a closer to the nanosheets 21a in the Y direction are exposed, not covered with the gate interconnect 136a.

Similarly, the nanosheets 21b and the nanosheets 26b are opposed to each other in the Y direction, the nanosheets 21c and the nanosheets 26c are opposed to each other in the Y direction, the nanosheets 21d and the nanosheets 26d are opposed to each other in the Y direction, and the nanosheets 21e and the nanosheets 26e are opposed to each other in the Y direction. The faces of the nanosheets 21b, 21c, 21d, and 21e closer to the nanosheets 26b, 26c, 26d, and 26e, respectively, in the Y direction are exposed, not covered with the gate interconnects 131b, 131c, 131d, and 131e, respectively.

The faces of the nanosheets 26b, 26c, 26d, and 26e closer to the nanosheets 21b, 21c, 21d, and 21e, respectively, in the Y direction are exposed, not covered with the gate interconnects 136b, 136c, 136d, and 136e, respectively.

Also, since gate interconnects supplied with VDD and local interconnects supplied with VSS are formed across the p-type region and the n-type region, capacitances are formed between such gate interconnects and local interconnects. For example, focusing on the transistors P3 and N3, the gate interconnects 131c and 136c, mutually connected by the bridge 133c, are supplied with VDD through the metal interconnect 152. Also, the local interconnects 143 and 144 are supplied with VSS from the power line 12. Therefore, capacitances are formed between the gate interconnects 131c and 136c with the bridge 133c therebetween and the local interconnects 143 and 144.

As described above, in this embodiment, in the transistors N2, N3, and N4, capacitances are produced between the nanosheets 26b, 26c, and 26d and the gate interconnects 136b, 136c, and 136d. Also, the faces of the nanosheets 21b, 21c, and 21d closer to the nanosheets 26b, 26c, and 26d are exposed from the gate interconnects 131b, 131c, and 131d, and the faces of the nanosheets 26b, 26c, and 26d closer to the nanosheets 21b, 21c, and 21d are exposed from the gate interconnects 136b, 136c, and 136d. Therefore, since the spacing between the nanosheets 21b, 21c, and 21d and the nanosheets 26b, 26c, and 26d can be reduced, the area of the capacitive cell can be made smaller. In addition, in the transistors P3 and N3, for example, large capacitances can be secured between the gate interconnects 131c and 136c with the bridge 133c therebetween and the local interconnects 143 and 144.

In this embodiment, the fixed value output unit may be omitted. In this case, the capacitive cell may be configured so as to supply VDD directly to the gates of the transistors N2, N3, and N4, for example.

While three n-type transistors are provided to constitute the capacitance in this embodiment, the number of transistors constituting the capacitance is not limited to this.

Also, as in the alteration of the first embodiment, two or more stacks of nanosheets may be placed in the Y direction in each transistor.

(Alteration 1)

The capacitive cell of the above embodiment can also be configured by exchanging the conductivity types of the transistors.

Figure 9:
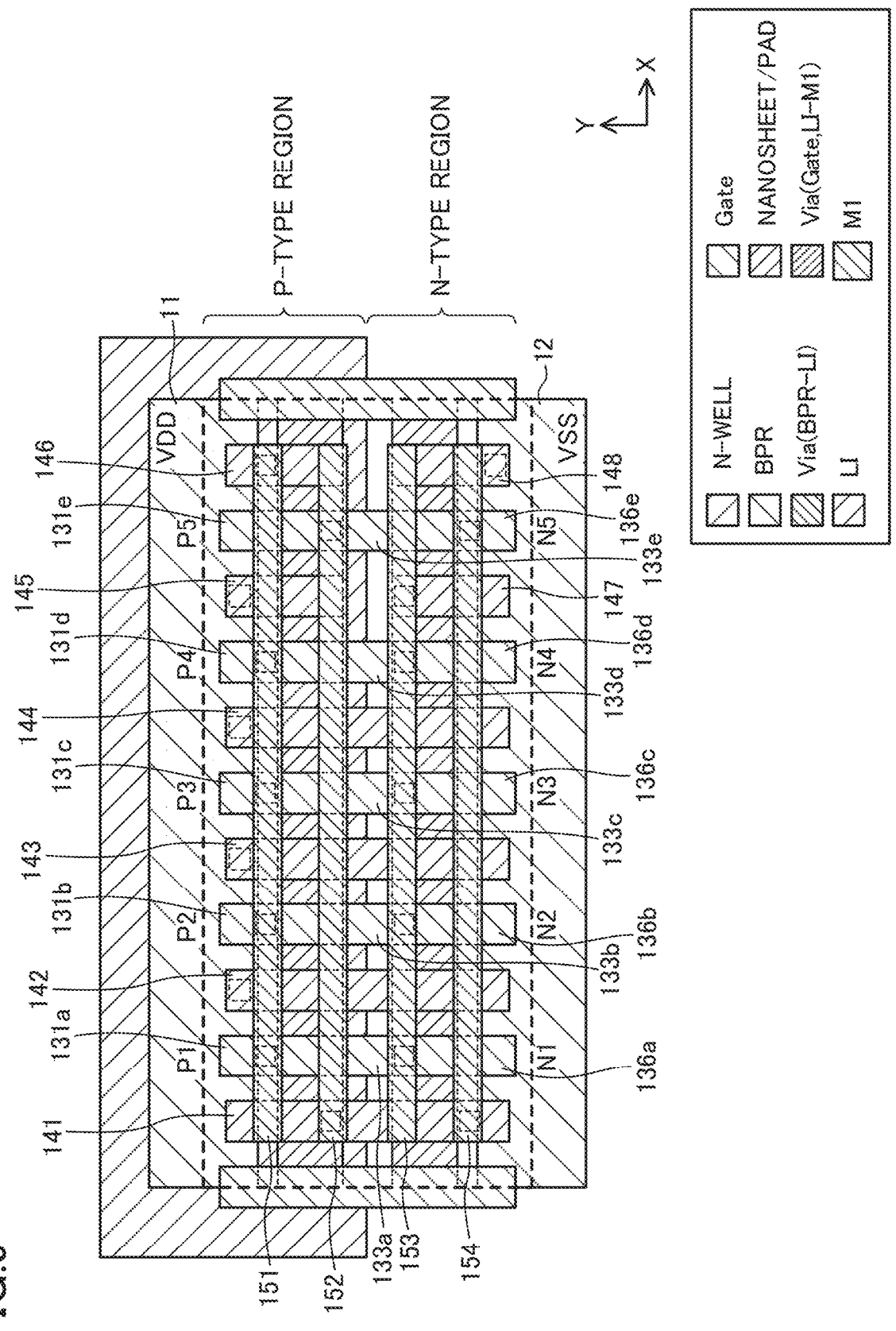
FIG. 9 is a plan view showing a layout structure of a capacitive cell according to Alteration 1 of the second embodiment.

FIG. 9 is a plan view showing a layout structure of a capacitive cell according to Alteration 1 of the second embodiment. The layout structure shown in FIG. 9 corresponds to one obtained by inverting the layout structure of FIG. 6 vertically in the figure, exchanging the p-type and the n-type, and exchanging VDD and VSS. In the layout structure of FIG. 9, the placement of the power lines, the transistors, the gate interconnects, the local interconnects, and the M1 interconnects is similar to that in the layout structure of FIG. 6, but the connection relations between the M1 interconnects and the local interconnects/gate interconnects and the connection relations between the local interconnects and the power lines are different from those in the layout structure of FIG. 6.

Figure 10:
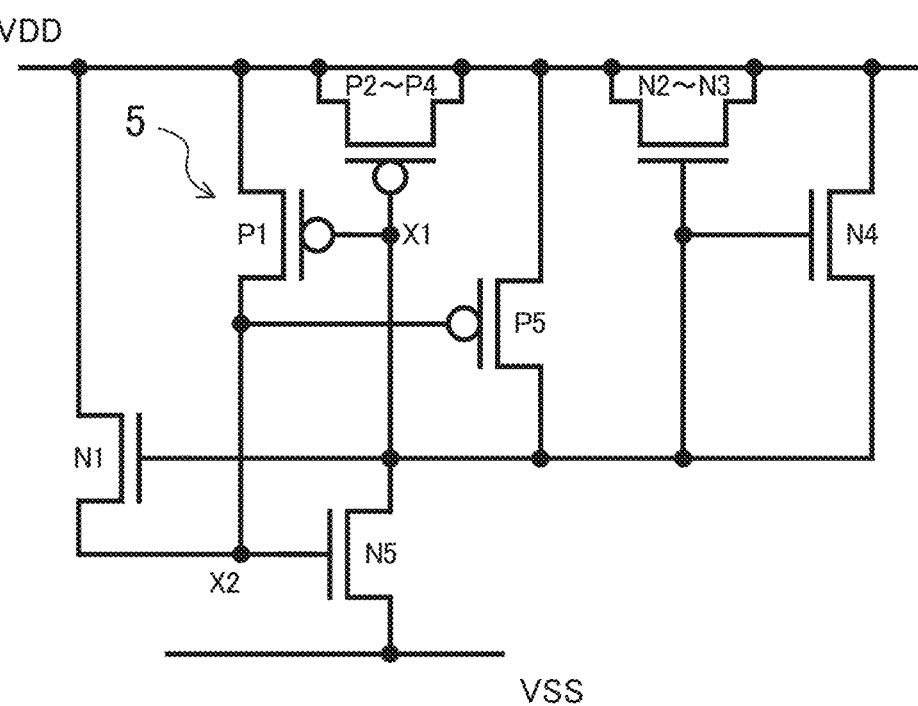
FIG. 10 is a circuit diagram of the capacitive cell shown in FIG. 9.

FIG. 10 is a circuit diagram of the capacitive cell shown in FIG. 9. The circuit of FIG. 10 corresponds to one obtained by inverting the circuit of FIG. 8 vertically in the figure, exchanging the p-type and the n-type, and exchanging VDD and VSS.

As shown in FIG. 10, the cell shown in FIG. 9 has p-type transistors P1, P2, P3, P4, and P5 and n-type transistors N1, N2, N3, N4, and N5. The transistors P2 to P4 function as capacitances. The transistor P1 and the transistor N5 constitute a fixed value output unit 5. The fixed value output unit 5 outputs a low fixed value (VSS) to a node X1 and a high fixed value (VDD) to a node X2. The transistor P1 is connected to VDD at its source, to the gate of the transistor N5 at its drain, and to the drain of the transistor N5 at its gate. The transistor N5 is connected to VSS at its source and to the gate of the transistor P1 at its drain. The gate of the transistor P1 corresponds to the node X1, and the gate of the transistor N5 corresponds to the node X2.

The transistors P2 to P4 are connected to VDD at their sources and drains and to the node X1 at their gates. Since VSS is output to the node X1 from the fixed value output unit 5, the transistors P2 to P4 function as capacitances. The transistors N1 to N4 and the transistor P5 are off-state transistors.

In FIG. 9, the local interconnects 142, 143, 144, and 145 are connected with the power supply line 11 through vias. The local interconnect 148 is connected with the power line 12 through a via. The metal interconnect 151 is connected with the gate interconnects 131a, 131b, 131c, and 131d through vias and also connected with the local interconnect 146 through a via. The metal interconnect 152 is connected with the gate interconnect 131e through a via and also connected with the local interconnect 141 through a via. The metal interconnect 153 is connected with the gate interconnects 136a, 136b, 136c, and 136d through vias and also connected with the local interconnect 147 through a via. The metal interconnect 154 is connected with the gate interconnect 136e through a via and also connected with the local interconnect 141 through a via.

In this alteration, also, similar effects to those obtained in the above embodiment are obtained.

(Alteration 2)

Figure 11:
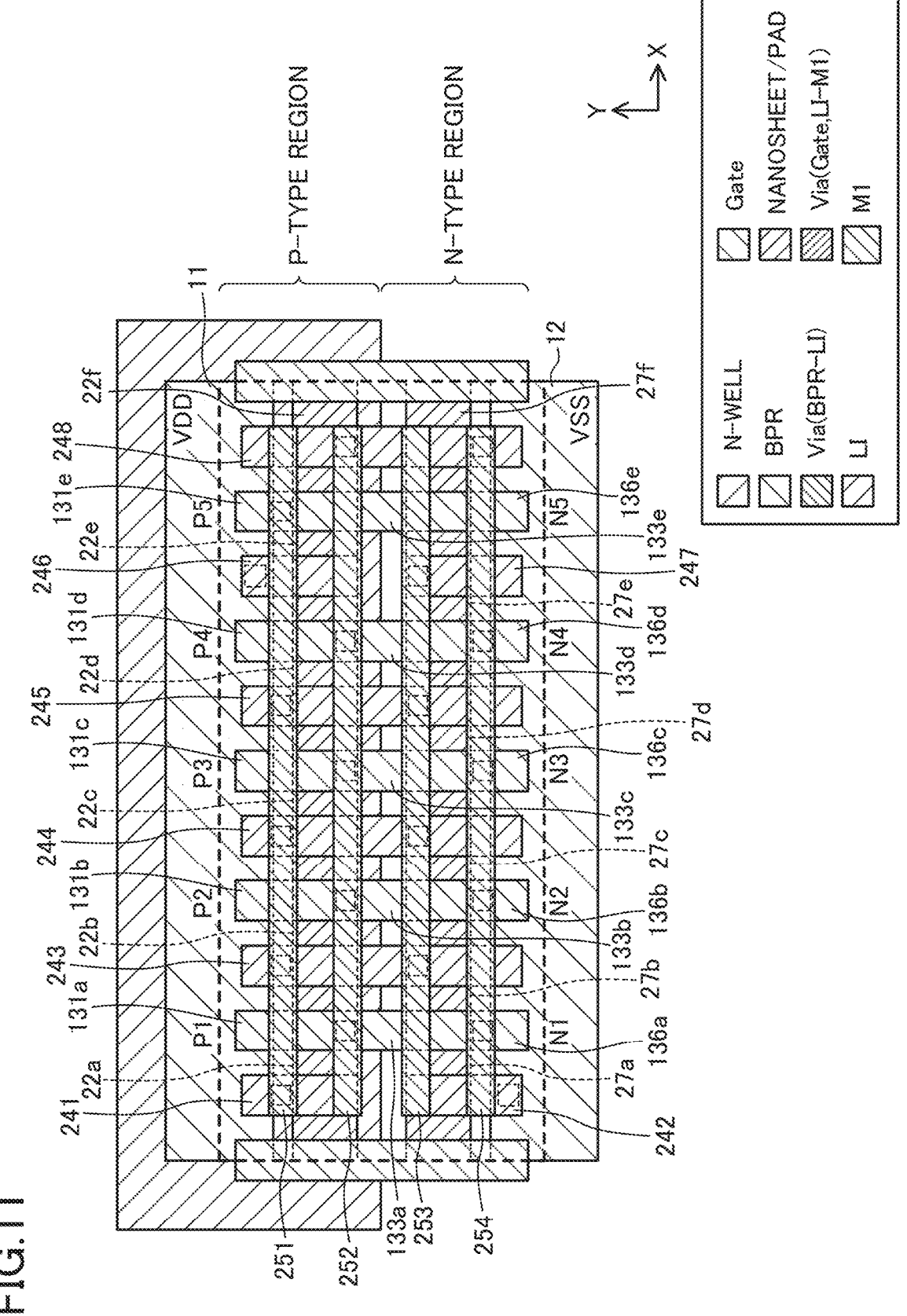
FIG. 11 is a plan view showing a layout structure of a capacitive cell according to Alteration 2 of the second embodiment.

FIG. 11 is a plan view showing a layout structure of a capacitive cell according to Alteration 2 of the second embodiment. The layout structure shown in FIG. 11 is similar to the layout structure of FIG. 6 in the placement of the power lines, the transistors, and the gate interconnects, but is different partly in the placement of the local interconnects and also different in the connection relations between the M1 interconnects and the local interconnects/gate interconnects and the connection relations between the local interconnects and the power lines.

Figure 12:
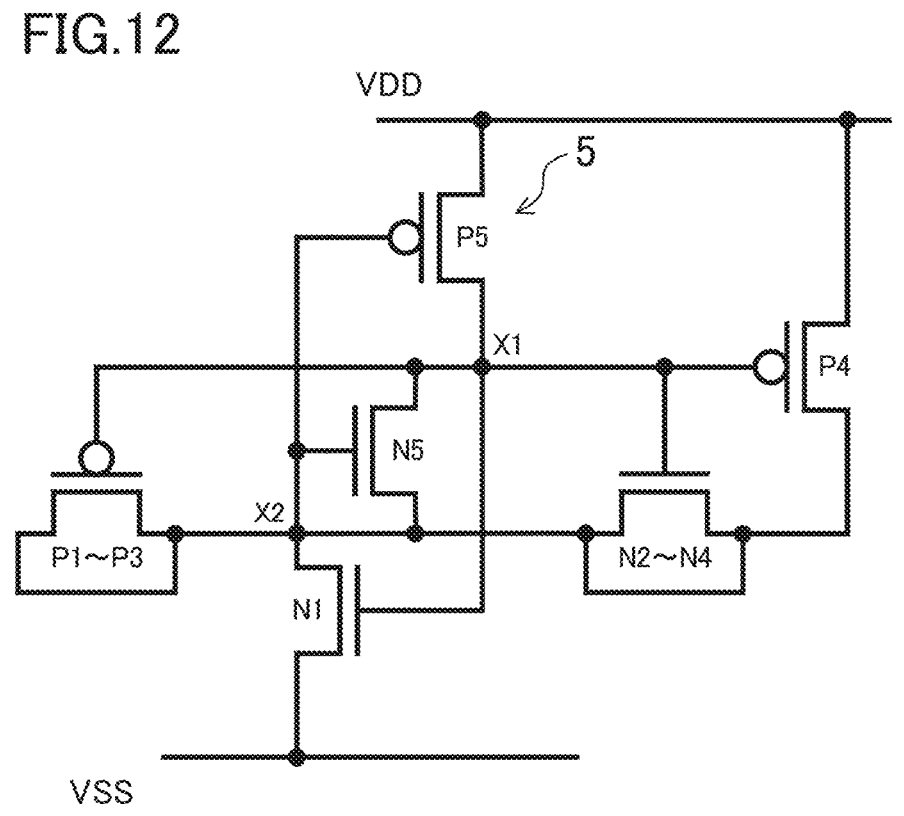

FIG. 12 is a circuit diagram of the capacitive cell shown in FIG. 11. The circuit of FIG. 12 corresponds to one obtained by connecting the sources and drains of the transistors P1 to P4 and N2 to N4, which are directly connected to VSS in the circuit of FIG. 8, to a node X2 to which a fixed value output unit 5 outputs a low fixed value (VSS).

As shown in FIG. 12, the cell shown in FIG. 11 has p-type transistors P1, P2, P3, P4, and P5 and n-type transistors N1, N2, N3, N4, and N5. The transistors N2 to N4 function as capacitances. The transistor P5 and the transistor N1 constitute the fixed value output unit 5. The fixed value output unit 5 outputs a high fixed value (VDD) to a node X1 and the low fixed value (VSS) to the node X2. The transistor P5 is connected to VDD at its source, to the gate of the transistor N1 at its drain, and to the drain of the transistor N1 at its gate. The transistor N1 is connected to VSS at its source and to the gate of the transistor P5 at its drain. The gate of the transistor N1 corresponds to the node X1, and the gate of the transistor P5 corresponds to the node X2.

The transistors N2 to N4 are connected to the node X2 at their sources and drains and to the node X1 at their gates. Since VDD is output to the node X1 from the fixed value output unit 5 and VSS is output to the node X2 from the fixed value output unit 5, the transistors N2 to N4 function as capacitances.

The transistors P1 to P4 and the transistor N5 are off-state transistors. Although the transistors P1 to P4 and N5 are not necessarily required for the circuit configuration of the capacitive cell, the presence of these transistors improves the regularity of the layout of the capacitive cell, which improves the ease of device manufacture, improves the yield, and reduces manufacturing variations.

Local interconnects 241, 242, 243, 244, 245, 246, 247, and 248 extending in the Y direction are formed in a local interconnect layer. The local interconnect 241 is connected with the pad 22a. The local interconnect 242 is connected with the pad 27a and also connected with the power line 12 through a via. The local interconnect 243 is connected with the pads 22b and 27b. The local interconnect 244 is connected with the pads 22c and 27c. The local interconnect 245 is connected with the pads 22d and 27d. The local interconnect 246 is connected with the pad 22e and also connected with the power line 11 through a via. The local interconnect 247 is connected with the pad 27e. The local interconnect 248 is connected with the pads 22f and 27f.

Metal interconnects 251, 252, 253, and 254 extending in the X direction are formed in an M1 interconnect layer. The metal interconnects 252 and 254 correspond to the node X1 of the circuit, and the metal interconnects 251 and 253 correspond to the node X2 of the circuit. The metal interconnect 251 is connected with the local interconnects 241, 243, 244, and 245 through vias and also connected with the gate interconnect 131e through a via. The metal interconnect 252 is connected with the gate interconnects 131a, 131b, 131c, and 131d through vias and also connected with the local interconnect 248 through a via. The metal interconnect 253 is connected with the local interconnects 243, 244, 245, and 247 through vias. The metal interconnect 254 is connected with the gate interconnects 136a, 136b, 136c, and 136d through vias and also connected with the local interconnect 248 through a via.

In this alteration, also, similar effects to those obtained in the above embodiment are obtained. In addition, in this alteration, since the sources and drains of the transistors other than the transistor N1 constituting the fixed value output unit are not directly connected to VSS, occurrence of a device breakdown caused by electrostatic discharge (ESD) can be prevented.

In this alteration, also, as in Alteration 1, the capacitive cell can be configured by exchanging the conductivity types of the transistors.

While the power lines supplying VDD and VSS are BPRs in the above embodiments and alterations, the configuration is not limited to this. The power lines may be M1 interconnects, for example.

While four M1 interconnects extending in the X direction are formed in the above embodiments and alterations, some of the M1 interconnects may be omitted.

According to the present disclosure, a layout structure of a large-capacity capacitive cell using forksheet FETs can be implemented. The present disclosure is therefore useful for downsizing and higher integration of semiconductor chips, for example.

What is claimed is:

1. A semiconductor integrated circuit device including a standard cell that is a capacitive cell, the standard cell having a first region in which first conductivity type transistors are formed and a second region in which second conductivity type transistors are formed lying adjacent to each other in a first direction, comprising:

a first nanosheet extending in a second direction vertical to the first direction in the first region;

a second nanosheet extending in the second direction in the second region;

a first gate interconnect extending in the first direction, formed to surround a periphery of the first nanosheet in the first direction and a third direction perpendicular to the first and second directions;

a first pair of pads each connected with each end of the first nanosheet in the second direction;

a second gate interconnect extending in the first direction, formed to surround a periphery of the second nanosheet in the first direction and the third direction; and a second pair of pads each connected with each end of the second nanosheet in the second direction, wherein the first pair of pads are supplied with a first power supply voltage, and the first gate interconnect is supplied with a second power supply voltage different from the first power supply voltage, and the first nanosheet and the second nanosheet are opposed to each other in the first direction, the first nanosheet is exposed from the first gate interconnect on a face at either one of first and second sides in the first direction, and the second nanosheet is exposed from the second gate interconnect on a face at the other one of the first and second sides in the first direction.

2. The semiconductor integrated circuit device of claim 1, wherein each of the first and second nanosheets is constituted by a stacked structure of a plurality of nanosheets overlapping as viewed in plan.

3. The semiconductor integrated circuit device of claim 1, wherein the first and second gate interconnects are placed at a same position in the second direction.

4. The semiconductor integrated circuit device of claim 1, comprising:

a first power line extending in the second direction, supplying the first power supply voltage;

a second power line extending in the second direction, supplying the second power supply voltage; and a fixed value output unit connected with the first and second power lines, supplying the second power supply voltage to the first gate interconnect, wherein the fixed value output unit includes a first transistor of the first conductivity type formed in the first region, connected with the first power line at its source, and a second transistor of the second conductivity type formed in the second region, connected with the second power line at its source, the first gate interconnect is electrically connected with a gate of the first transistor and a drain of the second transistor, and a drain of the first transistor is connected with a gate of the second transistor.

5. The semiconductor integrated circuit device of claim 1, wherein the second pair of pads are supplied with the second power supply voltage, and the second gate interconnect is supplied with the first power supply voltage.

6. The semiconductor integrated circuit device of claim 1, wherein the second gate interconnect is supplied with the second power supply voltage.

* * * * *